United States Patent
Sunohara et al.

(10) Patent No.: US 8,062,927 B2
(45) Date of Patent: Nov. 22, 2011

(54) WIRING BOARD AND METHOD OF MANUFACTURING THE SAME, AND ELECTRONIC COMPONENT DEVICE USING THE WIRING BOARD AND METHOD OF MANUFACTURING THE SAME

(75) Inventors: Masahiro Sunohara, Nagano (JP); Kiyoshi Ol, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 14 days.

(21) Appl. No.: 12/662,300

(22) Filed: Apr. 9, 2010

(65) Prior Publication Data

US 2010/0192371 A1 Aug. 5, 2010

Related U.S. Application Data

(62) Division of application No. 12/332,572, filed on Dec. 11, 2008, now Pat. No. 7,859,121.

(30) Foreign Application Priority Data

Jan. 9, 2008 (JP) .................................. 2008-002649

(51) Int. Cl.
*H01L 21/44* (2006.01)
(52) U.S. Cl. ................. 438/108; 257/E21.511
(58) Field of Classification Search .................. 438/108, 438/612, 613, 614; 257/E21.511, E21.513
See application file for complete search history.

(56) References Cited

U.S. PATENT DOCUMENTS

| | | | |
|---|---|---|---|
| 6,333,565 B1 | 12/2001 | Hashimoto | 257/781 |
| 6,583,516 B2 | 6/2003 | Hashimoto | 257/781 |
| 6,900,548 B2 | 5/2005 | Hashimoto | 257/781 |
| 7,038,323 B2 | 5/2006 | Hashimoto | 257/781 |
| 7,098,476 B2 * | 8/2006 | Babich et al. | 257/62 |
| 7,271,499 B2 | 9/2007 | Hashimoto | 257/781 |
| 7,420,285 B2 | 9/2008 | Hashimoto | 257/781 |
| 2005/0236104 A1 | 10/2005 | Tanaka | |
| 2006/0043604 A1 | 3/2006 | Suga et al. | |
| 2009/0242122 A1 | 10/2009 | Tanaka | |

FOREIGN PATENT DOCUMENTS

| | | |
|---|---|---|
| JP | 11-195676 | 7/1999 |
| JP | 2005-340761 A | 12/2005 |
| JP | 2005-354120 | 12/2005 |
| JP | 2006-066808 A | 3/2006 |

OTHER PUBLICATIONS

Office Action dated Jul. 26, 2011 corresponding to Japanese Patent Application No. 2008-002649 with Partial English translation.

* cited by examiner

*Primary Examiner* — Quoc Hoang
(74) *Attorney, Agent, or Firm* — Kratz, Quintos & Hanson, LLP

(57) ABSTRACT

A wiring board is provided with an external connection terminal to which an electrode terminal of an electronic component is to be connected. The external connection terminal is formed so that a portion thereof is electrically connected to a pad portion exposed from an outermost insulating layer on an electronic component mounting surface of a wiring board body and so that an air gap is kept between a portion of the external connection terminal, to which the electrode terminal of the electronic component is to be connected, and the insulating layer.

4 Claims, 6 Drawing Sheets

TOP VIEW

PERSPECTIVE VIEW

TOP VIEW

PERSPECTIVE VIEW

UNDER TEMPERATURE CYCLIC TEST

UNDERFILL RESIN FILLING (THERMO SETTING)

WIRING BOARD AND METHOD OF MANUFACTURING THE SAME, AND ELECTRONIC COMPONENT DEVICE USING THE WIRING BOARD AND METHOD OF MANUFACTURING THE SAME

CROSS-REFERENCE TO RELATED APPLICATIONS

This application is based on and claims priority of Japanese Patent Application No. 2008-002649 filed on Jan. 9, 2008; and is a Divisional of prior application Ser. No. 12/332,572 filed on Dec. 11, 2008, now U.S. Pat. No. 7,859,121, the entire contents of which are incorporated herein by reference.

BACKGROUND OF THE INVENTION (a) Field of the Invention

The present invention relates to a technique of mounting an electronic component such as a semiconductor device on a wiring board, and particularly to a wiring board (hereinafter also referred to as "package" for the sake of convenience) adapted for effectively bonding an electronic component by using a conductive bump as well as a method of manufacturing the same, and an electronic component device using the wiring board as well as a method of manufacturing the same.

(b) Description of the Related Art

For surface mounting of an electronic component (a chip) such as a semiconductor device on a wiring board (a package), wire bonding, flip chip bonding or the like is used as means for providing an electrical connection between the chip and the package. The wire bonding requires a bonding area (an area having an arrangement of pads for wire connections) around the chip mounted on the package, resulting in the package with a correspondingly large area, while the flip chip bonding is effective in a reduction in size of the package, since this bonding permits mounting of the chip on the package via a conductive bump and thus eliminates the need for the bonding area around the chip.

In an electronic component device of such a flip chip bonding type, the electrical connection between the chip and the package is accomplished by using: one method (namely, bonding using the same metal) that involves providing bumps made of the same metallic material on both the chip and the package, or alternatively providing a metal bump only on the chip, and bonding the chip and the package together with the bumps made of the same metal sandwiched therebetween; or another method (namely, bonding using different metals) that involves providing bumps made of different metallic materials on the chip and the package, respectively, and bonding the chip and the package together with the bumps made of different metals. For example, the bonding using the same metal includes bonding of a solder bump to a solder bump, while the bonding using different metals includes bonding of a copper (Cu) bump to a solder bump, bonding of a gold (Au) bump to a solder bump, and the like.

An example of techniques related to the above-mentioned conventional techniques is disclosed in Japanese unexamined Patent Publication (JPP) (Kokai)11-195676. The technique disclosed in this publication provides a semiconductor chip mounting structure provided with a projection formed in such a position on at least any one of an electrode provided on the surface of the semiconductor chip and an electrode provided on the surface of a circuit board that the projection would come in contact with a conductive bump, the projection being deformable when applied with pressure. Furthermore, another example of the related techniques is disclosed in JPP (Kokai) 2005-354120. The technique disclosed in this publication provides a structure including a semiconductor device having electrodes; a passivation film provided on the surface of the semiconductor device so as to avoid at least the portion of each electrode; a conductive foil provided above the surface having the passivation film formed thereon, with a predetermined space in the direction of thickness therebetween; an external electrode formed on the conductive foil; an interlayer formed between the passivation film and the conductive foil, and configured to support the conductive foil; and wiring that provides an electrical connection between the electrode and the conductive foil. In the interlayer, a concave portion is formed under a region, of the conductive foil, inclusive of a bonding portion bonded to the external electrode, the concave portion having a diameter gradually increasing from the passivation film side to the conductive foil side.

As mentioned above, in the conventional electronic component device of the flip chip bonding type, the electrical connection between the chip and the package is accomplished by the bonding using the bumps made of the same metal, or the bonding using the bumps made of different metals. Generally, such an electronic component device undergoes, prior to shipment, an electrical test on its detailed functions (a product reliability evaluation) with the chip mounted on the package. However, the conventional electronic component device of the flip chip bonding type encounters problems as given below when subjected to such a test for reliability evaluation.

Specifically, the bonding using different metals involves the formation of an alloy layer at the bonding interface between the metals. For example, as shown in FIG. 6A, assuming that the bonding involves: providing solder bumps BP1 (containing tin (Sn) as the main metal) respectively on pad portions 42 (e.g., copper (Cu)/nickel (Ni)/gold (Au) plating layers) exposed from portions of a protection film 41 (e.g., a solder resist layer) of a wiring board 40; providing copper (Cu) bumps BP2 respectively on pad portions 52 (e.g., aluminum (Al) conductor layers) exposed from portions of a protection film 51 (e.g., a passivation film) of a chip 50; and bonding the metal bumps BP1 and BP2 together by melting or the like. In this case, alloy layers (Cu—Sn) BM are formed, respectively, at the bonding interfaces between the metal bumps BP1 and BP2.

The alloy layer BM has the following problems. Because of being generally brittle to thermal stress, the alloy layer BM may possibly break off under a temperature cyclic test (e.g., a test to determine a change in product characteristics caused by repeated cycles of changing temperature within a range from +125° C. to +150° C. and temperature within a range from 40° C. to −65° C.) after chip mounting. In some cases, "break-off" may possibly occur in the alloy layer BM (in a portion indicated by reference BR in FIG. 6A) as shown in FIG. 6A. Also, the alloy layer BM has another problem. When a high-temperature exposure test (e.g., a test in which device test target is left in an environment at a temperature of 150° C. for a given period of time) is performed, heat facilitates the flowing of atoms of metal, thus causing an enlargement of the area of the alloy layer BM, and in turn, an increase in the likelihood of occurrence of break-off.

Description is given with regard to the occurrence of "break-off," which takes place when the metal bumps BP1 and BP2 made of different metals are used to form a bond between the chip 50 and the wiring board 40, as illustrated in FIG. 6A. However, "break-off" in such a conductive bump can possibly occur likewise even in the case of bonding using the same metal. For instance, if any one of eutectic solder (e.g., made up of tin (Sn) and lead (Pb)) and lead-free solder (e.g., made up of Sn, silver (Ag) and Cu) is used as material for the conductive bump, the same or similar break-off can possibly occur, depending on temperature conditions or testing time, because of distribution of Sn—Pb or Sn—Ag—Cu alloy in the conductive bump, although such a local alloy layer BM as is shown in FIG. 6A is not formed.

In order to cope with such "break-off," a method using an underfill resin for fixing of the chip to be mounted and the wiring board is widely adopted. FIG. 6B shows an example of the case. As illustrated in FIG. 6B, bumps BP to function as electrode terminals provided on the chip 50 to be mounted (specifically, the pad portions 52 exposed from the protection film 51) are connected by flip chip bonding to the pad portions 42 exposed from the protection film 41 of the wiring board 40. Then, an underfill resin 60 is filled into a gap between the wiring board 40 and the chip 50, and cured in the gap. By this method, the reliability of connection is improved, since the chip 50 and the wiring board 40 are integrally formed via the underfill resin 60.

However, the following problems arise. The method requires a process for filling the underfill resin 60 into the gap between the wiring board 40 and the chip 50, and hence causes problems in an increase of man-hours and a rise in cost. Additionally, as shown in FIG. 6B, baking (heat treatment) which is performed to cure the underfill resin 60 often leads to a shrinkage in the underfill resin 60, so that the wiring board 40 is warped at its edges toward a chip mounting surface, due to the fact that the coefficient of thermal expansion of the underfill resin 60 is different from that of the wiring board 40. Further, delamination of the chip 50 may possibly occur depending on the degree of warp, thus causing deterioration in the reliability of connection.

SUMMARY OF THE INVENTION

An object of the present invention is to provide a wiring board and a method of manufacturing the same, and an electronic component device and a method of manufacturing the same, which are capable of, even when stress is generated between the wiring board and an electronic component mounted thereon due to a difference in the coefficient of thermal expansion therebetween, effectively absorbing the stress and thereby achieving an improvement in the reliability of connection, and substantially eliminating a warp in the wiring board after mounting and thereby contributing to a reduction in cost.

According to the fundamental aspect of the invention, there is provided a wiring board for use in mounting an electronic component, including: an external connection terminal to which an electrode terminal of the electronic component is to be connected, wherein the external connection terminal is formed so that a portion thereof is electrically connected to a pad portion formed on an electronic component mounting surface of the wiring board and so that an air gap is kept between a portion of the external connection terminal, to which the electrode terminal of the electronic component is to be connected, and the electronic component mounting surface.

According to the configuration of the wiring board of the present invention, the air gap is formed between the portion of the external connection terminal, to which the electrode terminal of the electronic component is to be connected, and the insulating layer. Thus, even if stress (or thermal stress) is generated between the wiring board and the electronic component due to the difference in the coefficient of thermal expansion therebetween in a temperature cyclic test or the like of the wiring board with the electronic component mounted thereon, the presence of the air gap enables the external connection terminal to undergo vertical elastic deformation according to the generated stress, while keeping the electrode terminal of the electronic component connected to the pad portion of the wiring board. In other words, the external connection terminal can effectively absorb the generated thermal stress and thereby achieve an improvement in the reliability of connection.

Furthermore, this configuration eliminates the need for use of an underfill resin which has been conventionally used in the mounting of the electronic component on the wiring board, and can thus substantially eliminate such a warp in the wiring board as has been conventionally found. Also, this configuration eliminates the need for a process for filling the underfill resin, and can thus contribute to a reduction in cost.

According to another aspect of the invention, there is provided a method of manufacturing a wiring board, including: fabricating a wiring board body including a pad portion formed on an electronic component mounting surface thereof; forming a sacrificial layer having any one of a line shape and a dot shape in a plan view and having any one of a trapezoidal shape and a semicircular shape in a cross-sectional view, in a desired portion of an insulating layer formed on the electronic component mounting surface of the wiring board body; forming a plated wiring to form an external connection terminal to be connected to the pad portion, on the sacrificial layer; and removing the sacrificial layer.

Also, according to still another aspect of the invention, there is provided an electronic component device including: the wiring board according to the above aspect; and an electronic component mounted on the wiring board, and having an electrode terminal connected to an external connection terminal with a conductive bump sandwiched therebetween.

Furthermore, according to another aspect of the invention, there is provided a method of manufacturing an electronic component device, including: fabricating a wiring board body including a pad portion formed on an electronic component mounting surface thereof; forming a sacrificial layer having any one of a line shape and a dot shape in a plan view and having any one of a trapezoidal shape and a semicircular shape in a cross-sectional view, in a desired portion of an) insulating layer formed on the electronic component mounting surface of the wiring board body; forming a plated wiring to form an external connection terminal to be connected to the pad portion, on the sacrificial layer; mounting an electronic component by connecting an electrode terminal thereof to the plated wiring via a conductive bump; and removing the sacrificial layer.

Description is given, with reference to the following embodiments of the invention, of other features in configuration or process of the wiring board and the electronic component device using the same and the manufacturing methods therefor according to the present invention, and of characteristic advantages based on the features, and the like.

DESCRIPTION OF THE PREFERRED EMBODIMENTS

Description is given below with regard to preferred embodiments of the present invention with reference to the accompanying drawings.

Figure 1:
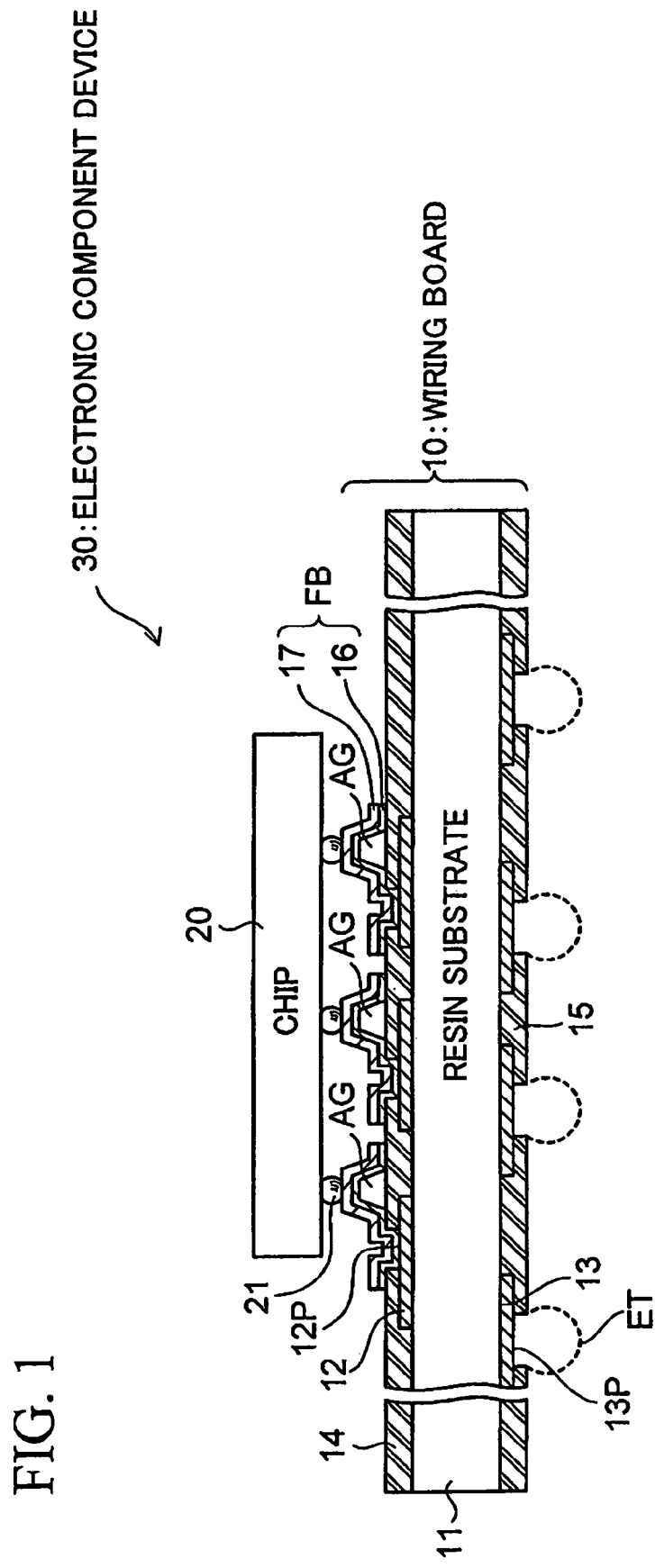
FIG. 1 is a sectional view showing a configuration of an electronic component device using a wiring board according to one embodiment of the present invention.

FIG. 1 shows in a cross-sectional view, a configuration of an electronic component device using a wiring board according to one embodiment of the present invention. As shown in FIG. 1, a semiconductor chip 20 as an electronic component is mounted on a wiring board 10 according to the embodiment so as to form an electronic component device 30 for shipment, but the wiring board 10 may be shipped without the chip 20 mounted thereon. In this instance, the chip 20 and its electrode terminals (bumps 21 for use as contact members for connections to the wiring board 10) are excluded from the illustrated configuration (the electronic component device 30).

The wiring board 10 according to the embodiment is basically configured by including a resin substrate 11 that forms the body of the wiring board 10; wiring layers 12 and 13 patterned to have desired patterns on both sides of the resin substrate 11; and insulating layers 14 and 15 to function as protection films, formed so as to cover both side surfaces exclusive of pad portions 12P and 13P defined in desired positions on the corresponding wiring layers 12 and 13. Further, there are provided external connection terminals FB characterizing the present invention, in desired positions on the insulating layer on a chip mounting surface side (the upper insulating layer 14 in the illustrated example).

The external connection terminals FB each consist of conductor layers 16 and 17 having two-layer structure formed in a desired shape by patterning as described later, and as shown in FIG. 1, the external connection terminal FB is partially electrically connected to the corresponding pad portion 12P exposed from the insulating layer 14, and is formed so as to keep an air gap AG between the external connection terminal FB and the insulating layer 14 at a position where the external connection terminal FB is connected to the corresponding electrode terminal (bump 21) of the chip 20.

The presence of the air gap AG enables the external connection terminal FB to undergo vertical elastic deformation according to induced stress, while keeping the connection between the electrode terminal (the bump 21) of the chip 20 and the pad portion 12P of the wiring board 10, even if a difference in the coefficient of thermal expansion between the wiring board 10 and the chip 20 causes stress (thermal stress) therebetween in a temperature cyclic test or the like after chip mounting. In other words, the external connection terminal FB has the function of effectively absorbing the thermal stress induced in the temperature cyclic test or the like after the chip mounting (a stress releasing function). As mentioned above, the external connection terminal FB is flexibly deformed and has a projecting shape in a portion in which the air gap AG is formed, as in the case of the typical conductive bump, and thus, hereinafter, the external connection terminal FB is also referred to as "flexible bump" for the sake of convenience.

Figure 2A:
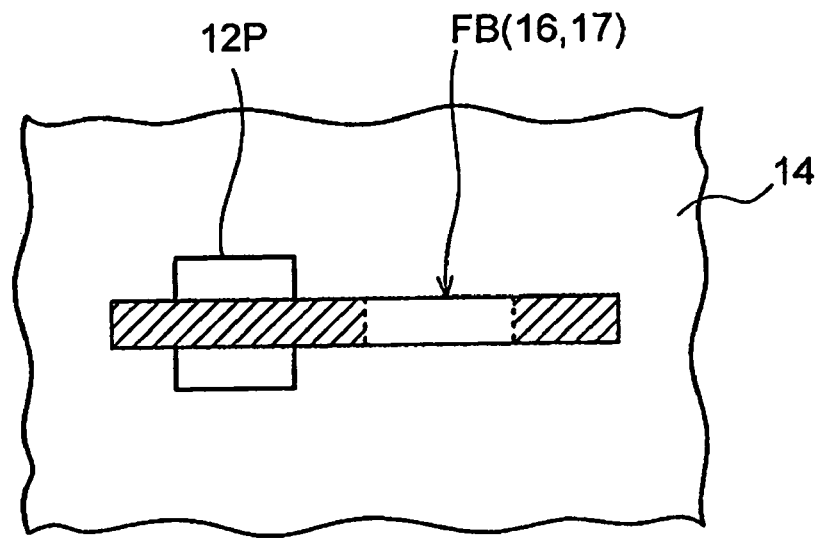
FIGS. 2A and 2B are a top view and a perspective view, respectively, schematically showing the structure of a principal part (i.e., a flexible bump) of the wiring board shown in FIG. 1.
Figure 2B:
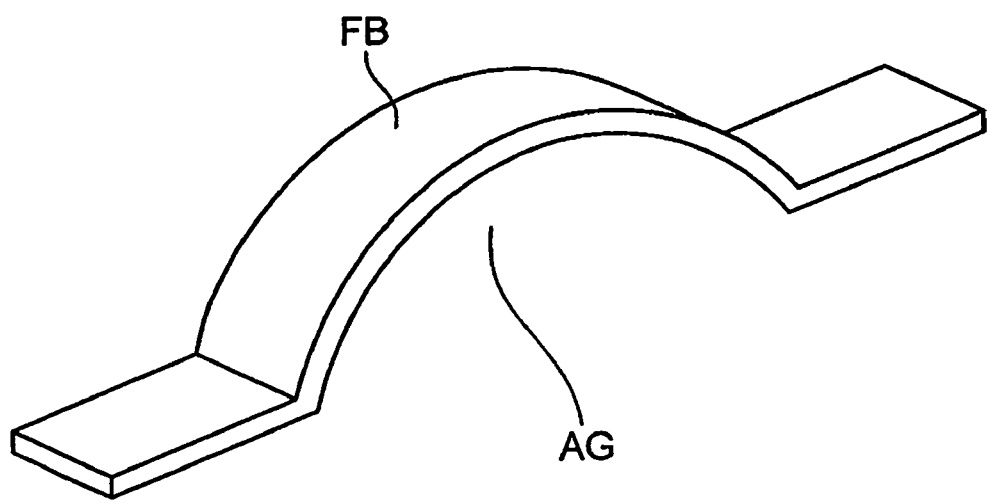

FIGS. 2A and 2B show in a schematic form the structure of the flexible bump FB, showing the shape (pattern) in a top view and the structure in a perspective view, respectively. The conductor layers 16 and 17 having two-layer structure (FIG. 1), which form the flexible bump FB, has the form of a narrow, long wiring pattern as shown in FIG. 2A, as seen in a plan view. Both ends (two hatched areas) of the wiring pattern are formed on the insulating layer 14, and are partially disposed on the pad portion 12P (electrically connected thereto). A substantially central portion of the wiring pattern (a portion not connected to any portion) is formed to have an arch as shown in FIG. 2B, and the air gap AG is secured under the arch-shaped portion.

In the embodiment, the electrode terminal of the chip 20 to be mounted is connected to the surface (the top surface as shown in FIG. 1) opposite to a portion of the flexible bump (external connection terminal) FB in which the air gap AG is formed, with a conductive bump 21 such as a solder bump interposed therebetween. Also, an external connection terminal (such as a metal bump (ball) ET or a metal pin as shown by the dotted lines in FIG. 1), which is used for mounting the wiring board 10 on a print circuit board such as a mother board, is bonded via solder or the like to the pad portion 13P exposed from the insulating layer 15 opposite to the chip mounting surface side. Such an external connection terminal may be provided at the time of shipment, or the pad portion 13P may remain exposed so that the external connection terminal can be later bonded to the pad portion 13P when necessary. In this instance, the surface of the pad portion 13P is subjected to a process such as nickel (Ni) and gold (Au) plating in advance.

Also, the resin substrate 11 which forms the wiring board body of the wiring board 10 may be in any form, provided that it is the substrate having the plated wiring layer on the outermost layer, in which the plated wiring layers are electrically connected through the resin substrate 11. The resin substrate 11 may or may not include the plated wiring layers formed inside thereof. Since the resin substrate 11 is not a member characterizing the present invention, detailed illustration is omitted; however, in the case of the form in which the plated wiring layers are formed inside the resin substrate 11, the outermost plated wiring layers are electrically connected through the plated wiring layers formed in the substrate with the insulating layers provided therebetween, and through via holes through which the plated wiring layers are interconnected. The form of the substrate includes, for example, a wiring substrate of multilayer structure which can be formed using build-up process. On the other hand, in the case of the form in which the plated wiring layers are not formed inside the resin substrate 11, the outermost plated wiring layers are electrically connected via through holes appropriately formed in desired positions on the resin substrate 11.

As shown in FIG. 1 and FIGS. 2A and 2B, the wiring board 10 according to the embodiment is characterized by including the flexible bumps (external connection terminals) FB to be connected to the electrode terminals (bumps 21) of the chip 20, and in that the flexible bumps FB are partially electrically connected to the pad portions 12P exposed from the outermost insulating layer 14 on the electronic component mounting surface side, and the air gap AG is secured between the flexible bumps FB and the insulating layer in portions connected to the electrode terminals (bumps 21) of the chip 20. Materials for structural members which form the wiring board 10 according to the embodiment, the sizes of the structural members, and the like, are described specifically in connection with processes to be described later.

Description is given below with regard to a method of manufacturing the wiring board 10 according to the embodiment (and the electronic component device 30 using the wiring board 10) with reference to FIGS. 3A to 4D showing manufacturing steps in order. Incidentally, for simplicity of illustration, only the configuration of portions associated with the present invention (the flexible bumps FB and their peripheries), namely, the chip mounting surface side of the wiring board is shown.

First, at the first step (FIG. 3A), a wiring board is prepared. The wiring board is at a stage before the formation of the flexible bumps FB characterizing the present invention. Specifically, there is prepared a structure including the wiring layers 12 and 13 (see FIG. 1) provided on both sides of the resin substrate 11 and patterned so as to have desired patterns; and the insulating layers 14 and 15 (see FIG. 1) to function as protection films, formed so as to cover both sides exclusive of pad portions 12P and 13P defined in desired positions on the wiring layers 12 and 13 is prepared.

As mentioned above, the resin substrate 11 may be in any form, provided that it is the substrate having the plated wiring layer on the outermost layer, in which the plated wiring layers are electrically connected through the resin substrate 11. For example, the wiring substrate of multilayer structure formed using the build-up process may be used. A typical manufacturing process is to repeat, in turn, formation of an insulating layer, formation of a via hole in the insulating layer, and formation, of a wiring pattern (a plated wiring layer) inclusive of the inside of the via hole, on each surface of a core substrate used as a base material. An epoxy resin is typically used as a material for the insulating layer, and copper (Cu) is typically used as a material for the plated wiring layer. The outermost wiring layers 12 and 13 formed through the above process are electrically connected through the plated wiring layers formed in the desired positions in the substrate, and the via holes through which the plated wiring layers are interconnected.

Since the external connection terminals (such as part of the flexible bumps FB, or the solder balls ET for use in mounting on a motherboard or the like) are bonded to the pad portions 12P and 13P (see FIG. 1) defined in the desired positions on the outermost wiring layers 12 and 13, it is desirable that the wiring layers (Cu) 12 and 13 be given nickel (Ni) plating and gold (Au) plating in this order. This is for the purpose of improving contact characteristics when the external connection terminals are bonded, and enhancing adhesion between the Cu layer which forms the pad portions 12P and 13P, and the Au layer, and thereby preventing diffusion of Cu in the Au layer. In other words, the pad portions 12P and 13P have a three-layer structure of Cu, Ni and Au.

Further, the insulating layers (solder resist layers) 14 and 15 (see FIG. 1) to function as the protection films are formed on both surfaces of the resin substrate 11. The formation of the insulating layers 14 and 15 can be accomplished, for example, by applying a photosensitive epoxy resin to the resin substrate 11 and the wiring layers 12 and 13, and patterning the resin layers to have desired patterns (the patterns exclusive of the pad portions 12P and 13P of the wiring layers 12 and 13).

At the next step (FIG. 3B), a sacrificial layer 18 to define the air gap AG in the flexible bump FB is formed on the insulating layer (the insulating layer 14) on the chip mounting surface side of the resin substrate 11. Preferably, a liquid resist such as a novolak-base resin or an epoxy-base resin may be used as a material for the sacrificial layer 18. The formation of the sacrificial layer 18 is accomplished by applying the liquid resist to the insulating layer 14 at a desired position using a dispenser, and drying the liquid resist. The desired position is selected at a position a little far away from the position of the pad portion 12P to be connected to part of the flexible bump FB to be finally formed (the position on the right side of the pad portion 12P in the illustrated example). The sacrificial layer 18 is formed so as to have a shape of a "line" or "dot" as seen in a plan view, and have a shape of a "trapezoid" or "semicircle" as seen in a cross-sectional view.

At the next step (FIG. 3C), a seed layer 16 for use as a power supply layer for electroplating in the later step is formed over the entire surface on which the sacrificial layer 18 is formed. In the embodiment, a conductor layer of titanium (Ti) is first formed over the entire surface (on the insulating layer 14, the sacrificial layer 18 and the pad portion 12P) with a thickness on the order of 0.1 μm by sputtering; a conductor layer of copper (Cu) is then formed on the Ti layer with a thickness on the order of 0.5 μm by sputtering, and thereby, the seed layer 16 having two-layer structure of Ti and Cu is formed.

At the next step (FIG. 3D), a plating resist is formed on the seed layer 16 using a patterning material, and an opening is formed in a desired portion of the plating resist (a resist layer 19 having an opening OP is formed). The opening OP is formed by patterning according to the shape of the desired wiring pattern to be formed (the flexible bump FB shown in FIGS. 2A and 2B). A photosensitive dry film or a liquid photoresist may be used as the pattering material.

For example, where the dry film is used, which typically has a structure in which a resist material is sandwiched between a polyester cover sheet and a polyethylene separator sheet, the patterned resist layer 19 is formed through the following steps: surface cleaning, pre-lamination process (separator sheet delamination), resist lamination in the air, exposure, cover sheet delamination, and development. Specifically, the formation of the resist layer 19 involves: first cleaning the surface of the seed layer 16; then laminating the dry film (having a thickness of about 25 μm) on the surface of the seed layer 16 by thermocompression bonding; curing the dry film by subjecting the dry film to exposure under ultraviolet (UV) irradiation using a mask (not shown) formed to have a desired wiring pattern; and further, etching away a corresponding portion using a predetermined developing solution (an organic-solvent-containing developing solution for a negative resist, or an alkali-base developing solution for a positive resist) (forming the opening OP), thereby yielding the resist layer 19 according to the desired wiring pattern.

Where the liquid photoresist is used, the resist layer 19 can be likewise formed in the desired pattern through process steps of: surface cleaning; resist coating on the surface; drying; exposure; and development. Note, in the embodiment, the liquid photoresist is used for the formation of the sacrificial layer 18 as mentioned above, and thus, from the viewpoint of process, it is preferable that the dry film be used for the formation of the resist layer 19. The reason for this is that the sacrificial layer 18 has to remain without being removed at the time when the resist layer 19 is removed in the later step. Therefore, where the liquid resist is used as the material for the plating resist (the resist layer 19), it is necessary that such a material that does not affect the sacrificial layer 18 when the resist layer 19 is removed in the later step be appropriately selected.

At the next step (FIG. 3E), the plated wiring layer 17 is formed on the seed layer 16 exposed through the opening in the resist layer 19 by electroplating using the seed layer 16 as the power supply layer. In the embodiment, the formation of the plated wiring layer 17 is accomplished by first forming a conductor layer of copper (Cu) of about 5 μm thickness on the seed layer 16 by electroplating; then forming a conductor layer of nickel (Ni) of about 5 µm thickness on the Cu layer by electroplating; further forming a conductor layer of gold (Au) of about 1 µm thickness on the Ni layer by electroplating, thereby yielding the plated wiring layer 17 having three-layer structure of Cu, Ni and Au. At this stage, the arch-shaped flexible bumps FB (16 and 17) as shown in FIGS. 2A and 2B are formed.

At the next step (FIG. 4A), the plating resist (the resist layer 19 shown in FIG. 3E) is removed. For example, where the dry film is used as the plating resist, an alkaline chemical liquid such as sodium hydroxide or a monoethanolamine-base liquid can be used for removal. Thereby, the plated wiring layer 17 and the seed layer 16 are exposed. At this time, the plated wiring layers 17 are electrically interconnected via the seed layer 16, as shown in FIG. 4A.

Figure 4A:
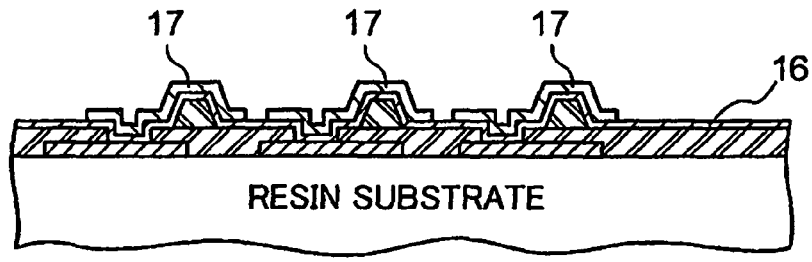
FIGS. 4A to 4D are sectional views showing steps following the steps shown in FIGS. 3A to 3E.
Figure 4B:
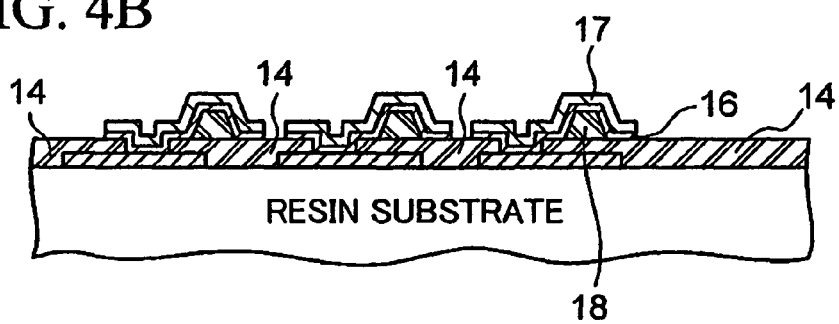
Figure 4C:
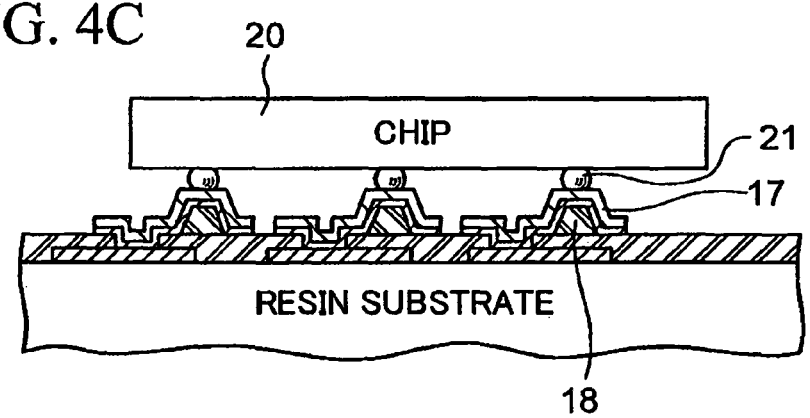
Figure 4D:
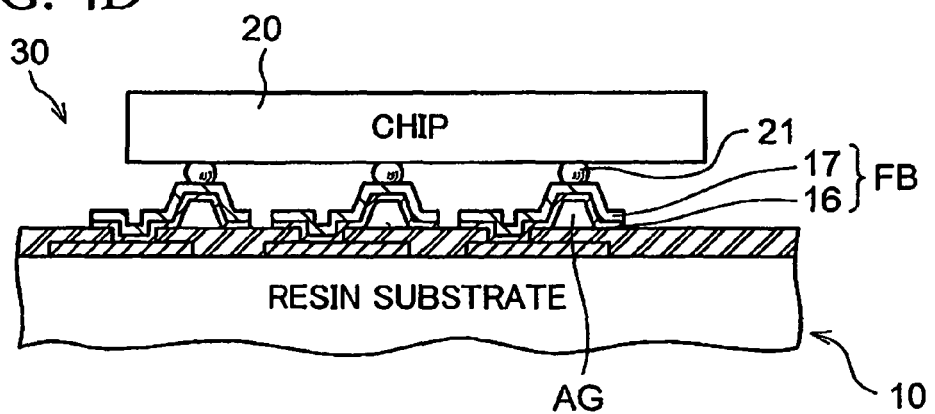

At the next step (FIG. 4B), the exposed seed layer 16 (see FIG. 4A) is selectively removed with respect to the plated wiring layer 17. For example, the selective etching of the exposed seed layer (Ti/Cu) 16 alone can be accomplished by first performing wet etching using a chemical liquid soluble only in copper (Cu), using the plated wiring layer 17 (having the Au deposited layer formed on the surface) as a mask; then performing wet etching using a chemical liquid soluble only in titanium (Ti). Thereby, the insulating layer 14 is exposed directly under the removed seed layer 16. At this stage, the plated wiring layers 17 (and the seed layers 16 directly thereunder) are insulated from each other as shown in FIG. 4B.

At the next step (FIG. 4C), the semiconductor chip 20 as the electronic component is mounted on the structure (in which the sacrificial layer 18 to be finally removed still remains) fabricated through the above steps. Specifically, the conductive bumps 21 to function as the electrode terminals, such as solder bumps, Au bumps, are formed on the chip 20 to be mounted, and the electrode terminal 21 of the chip 20 is electrically connected (by flip chip bonding) to a bump-shaped projecting portion (a portion to form the flexible bump FB) of the plated wiring layer 17.

At the final step (FIG. 4D), the sacrificial layer 18 is removed. In the embodiment, the liquid resist such as the novolak-base resin or the epoxy-base resin is used to form the sacrificial layer 18 as mentioned above, and thus, acetone, alcohol or the like can be used for removal. Alternatively, dry etching (ashing) using oxygen plasma may be performed to remove the sacrificial layer 18.

Through the above steps, the electronic component device 30 (FIG. 1) including the wiring board 10 according to the embodiment and the electronic component (the chip 20) mounted thereon is manufactured. Meanwhile, where the wiring board 10 is shipped without the chip 20 mounted thereon, the removal of the sacrificial layer 18 using the above method at the step shown in FIG. 4D can take place after the process performed at the step shown in FIG. 4B (the removal of the exposed seed layer 16), so that the wiring board 10 is obtained.

As described above, with the wiring board 10 (the electronic component device 30) according to the embodiment and the method of manufacturing the same, the portion of the flexible bump FB (the external connection terminal) connected to the electrode terminal (the bump 21) of the chip 20 to be mounted is shaped to the arch (see FIG. 2B), and in this portion, the air gap AG is formed between the flexible bump FB and the insulating layer 14. Therefore, even if stress (or thermal stress) is generated between the wiring board 10 and the chip 20 due to the difference in the coefficient of thermal expansion therebetween in the temperature cyclic test or the like after the chip mounting, the presence of the air gap AG enables the flexible bump FB to undergo vertical elastic deformation according to the generated stress, while maintaining the electrical connection between the electrode terminal (the bump 21) of the chip 20 and the pad portion 12P of the wiring board 10. In other words, the flexible bump FB can effectively absorb (release) the generated thermal stress and thereby improve the reliability of connection between the wiring board 10 and the chip 20.

Figure 6A:
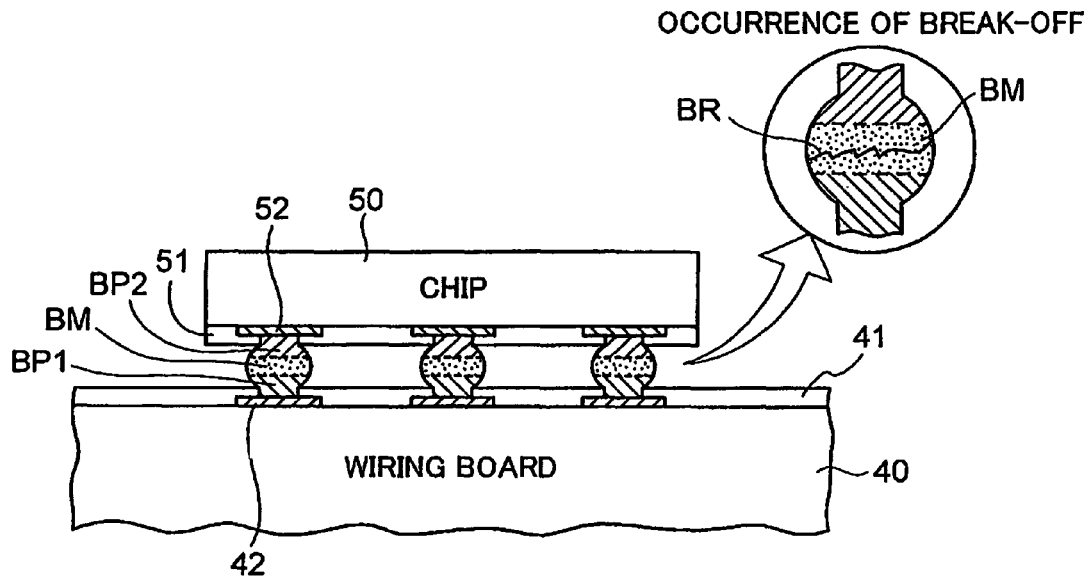
FIGS. 6A and 6B are views for explaining problems involved in conventional chip mounting.
Figure 6B:
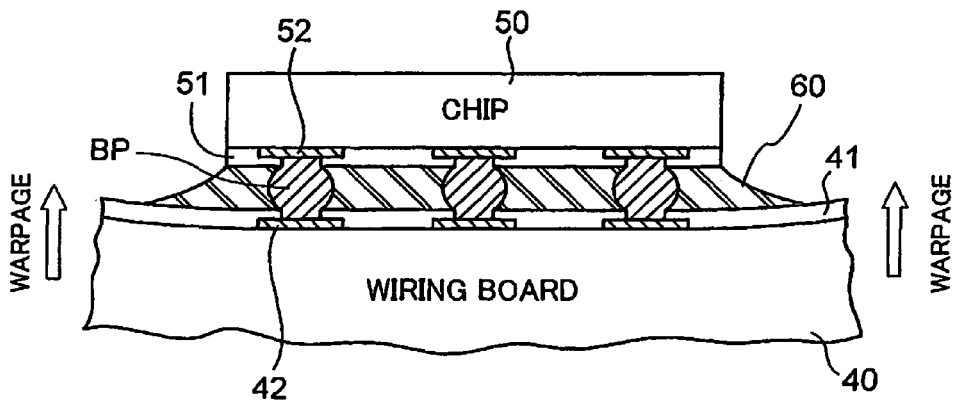

Moreover, this configuration eliminates the need for use of an underfill resin which has been conventionally used for the mounting of the chip 20 on the wiring board 10, and thus enables eliminating a disadvantage (the warp in the wiring board) as has been found in the prior art (FIG. 6B). Also, this configuration eliminates the need for a process for filling underfill resin, and thus enables contributing to a reduction in cost.

Figure 5A:
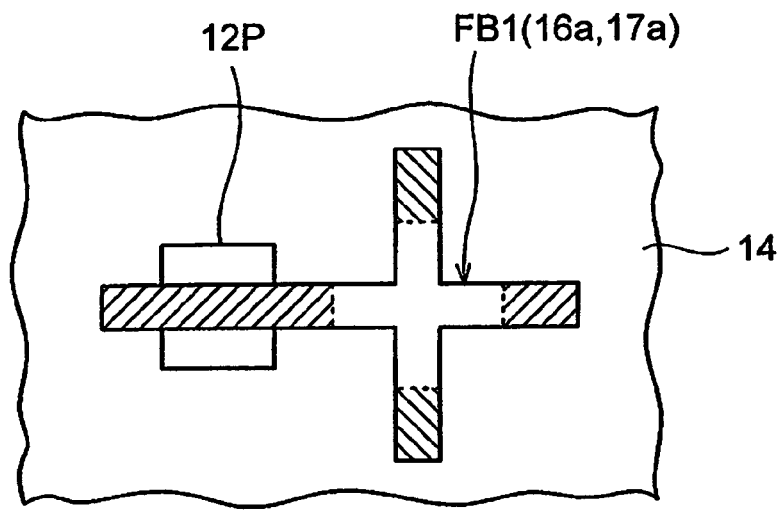
FIGS. 5A and 5B are a top view and a perspective view, respectively, schematically showing the structure of one modification of the principal part (i.e., the flexible bump) of the wiring board shown in FIG. 1.
Figure 5B:
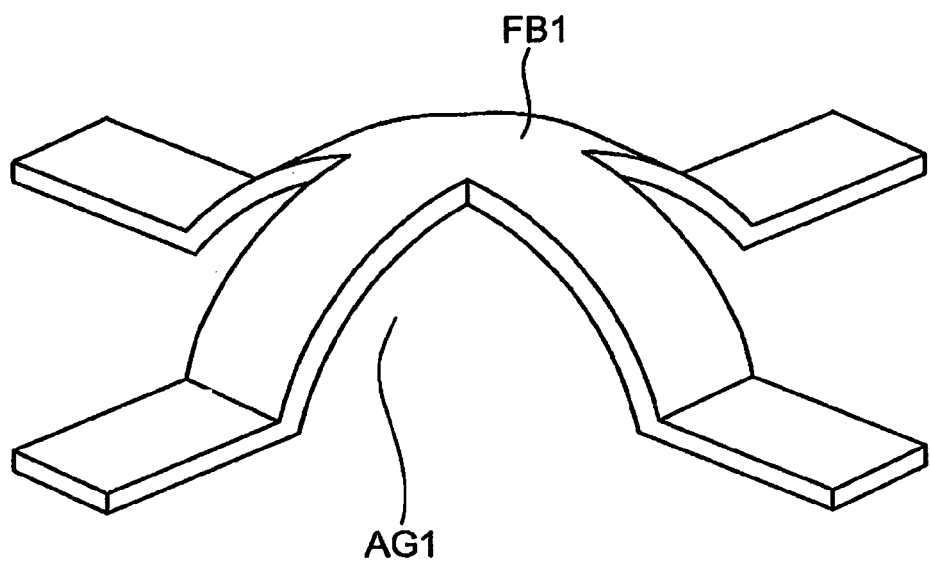

Description is given with regard to the configuration of the wiring board 10 according to the above-mentioned embodiment, taking the flexible bump FB having a narrow, long wiring pattern layout as shown in FIG. 2A as an example of the flexible bump (the external connection terminal) characterizing the present invention; however, of course, it will be understood that the form of the flexible bump is not limited to this, as is also apparent from the spirit of the present invention. FIGS. 5A and 5B show one modification of the flexible bump.

In the embodiment shown in FIGS. 5A and 5B, conductor layers (the conductor layers having two-layer structure in the same manner as shown in FIGS. 2A and 2B: a seed layer 16a and a plated wiring layer 17a) which form a flexible bump FB1 have the form of a cross-shaped wiring pattern, in a plan view, as shown in FIG. 5A. Ends (four hatched areas) of the cross-shaped wiring pattern are formed on the insulating layer 14, and are partially formed on the pad portion 12P (electrically connected to the pad portion 12P). A substantially central portion (a portion not connected to any portion) of the cross-shaped wiring pattern is shaped to have an arch as shown in FIG. 5B, and an air gap AG1 is secured under the arch-shaped portion. As in the case of the above-mentioned embodiment (see FIGS. 2A and 2B), the electrode terminal of the chip to be mounted is connected by flip chip bonding (not shown) via a solder bump or the like to the surface (the top surface as shown in FIG. 1) opposite to a portion of the flexible bump FB1 in which the air gap AG1 is formed. Meanwhile, the cross-shaped wiring pattern is shown in FIGS. 5A and 5B; however, it is not necessarily required that the wiring pattern be accurately "cross-shaped," and the wiring pattern is in any shape, provided that the wiring pattern is in the form of wiring patterns crossing each other.

Figure 3A:
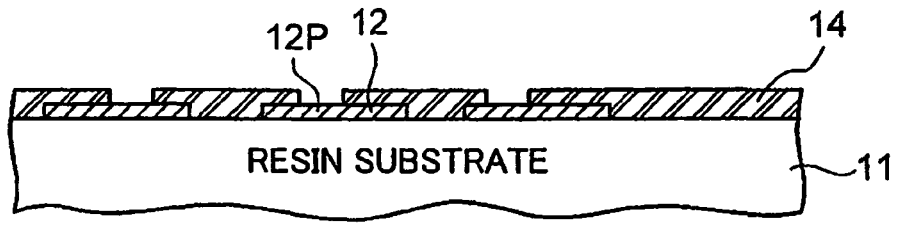
FIGS. 3A to 3E are sectional views showing steps in a method of manufacturing the wiring board (or the electronic component device) shown in FIG. 1.
Figure 3B:
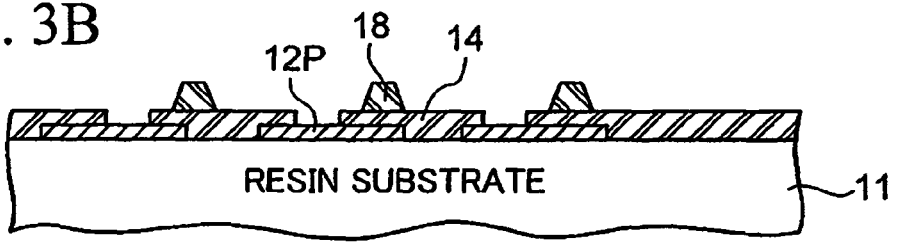
Figure 3C:
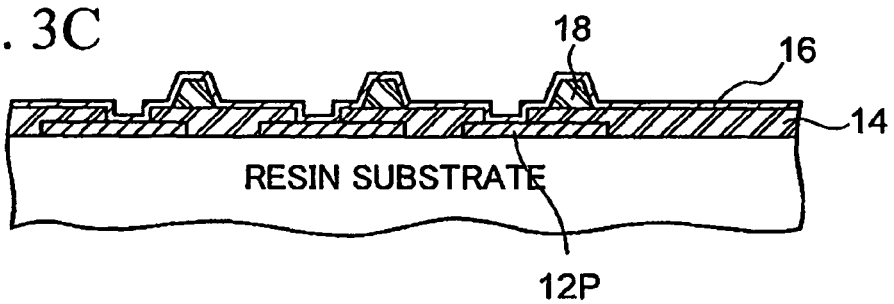
Figure 3D:
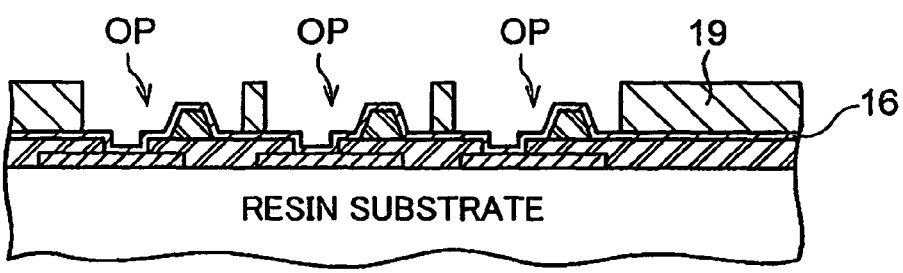
Figure 3E:
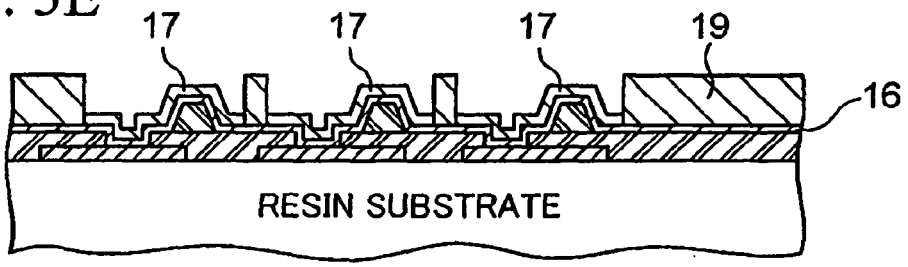

The formation of the cross-shaped wiring pattern (the flexible bump FB1) can be accomplished by single patterning which involves forming the resist layer 19 in a cross-shaped pattern, and then forming the plated wiring layer 17a, in the same manner as the processes performed at the steps shown in FIGS. 3D and 3E in the manufacturing process according to the above-mentioned embodiment.

According to the structure of the flexible bump FB1 of this embodiment, the chip mounted is supported at the ends (four portions) of the cross-shaped wiring pattern. This enables the flexible bump FB1 to undergo vertical elastic deformation according to generated stress, even if the stress (thermal stress) is generated between the wiring board 10 and the chip 20, resulting from the difference in the coefficient of thermal expansion therebetween, and thereby enables dispersing the stress in a two-dimensional direction parallel to the surface of the wiring board. In other words, this enables more effective dispersion of the stress, as compared to the above-mentioned embodiment (see FIGS. 2A and 2B) in which the chip is supported at two points (a state in which the generated stress can be dispersed in a one-dimensional direction parallel to the surface of the wiring board). This enables contributing to a further improvement in the reliability of connection between the mounted chip and the wiring board.

Additionally, the chip mounted is supported at the four points shown in FIGS. 5A and 5B; however, of course, it will be understood that the number of supporting points is not limited to four. It is essential only that the generated stress (thermal stress) can be dispersed in plural directions parallel to the surface of the wiring board, and for example, two cross-shaped wiring patterns may be combined to support the chip at eight points.

Also, description is given with regard to the processes (see FIGS. 3A to 4D) according to the above-mentioned embodiment, taking the case where the seed layer (Ti/Cu) 16 or 16a is given Cu/Ni/Au electroplating (the plated wiring layer 17 or 17a) to form the flexible bump FB or FB1; however, of course, it will be understood that the type of plating is not limited to this. Desirably, metal which improves elasticity is selected as a plating seed, taking into account the function (elastic deformation at the occurrence of thermal stress) required for the flexible bump FB or FB1. For example, in the step shown in FIG. 3E, the seed layer may be given Ni and cobalt (Co) alloy plating rather than Ni plating to form a plated wiring layer of Cu/NiCo/Au. This requires only a change of a plating liquid, and thus does not increase the number of steps.

Also, description is given with regard to the above-mentioned embodiment, taking the case where the insulating material such as the novolak-base resin or the epoxy-base resin is used as the material for the sacrificial layer 18 to define the air gap AG or AG1 of the flexible bump FB or FB1; however, of course, it will be understood that the material for the sacrificial layer 18 is not limited to the insulating material, as is also apparent from the spirit of the present invention. A conductive material may be used to form the sacrificial layer 18, taking into account that the sacrificial layer 18 does not remain by being finally removed. For example, copper (Cu) paste may be fed to a target (the insulating layer 14 in this case) by screen printing to form the sacrificial layer 18. When the sacrificial layer 18 is made of the conductive material (Cu), selective etching may be used for the final removal of the sacrificial layer 18, in the same manner as the process (the removal of the exposed seed layer 16) performed at the step shown in FIG. 4B.

Additionally, in the above-mentioned embodiment, the air gap AG or AG1 is provided a little away from the position of the pad portion 12P connected to part of the flexible bump FB or FB1; however, it is not necessarily required that the position of the air gap be, away from the pad portion 12P, and the air gap may be provided directly on the pad portion 12P. In this instance, the sacrificial layer 18 to define the air gap AG or AG1 is formed on the pad portion 12P (see FIG. 3B).

Furthermore, in the above-mentioned embodiment, description is given, taking the case where the resin substrate 11 (including the wiring layers 12 and 13 formed on the outermost layers, and the wiring layers 12 and 13 covered with the insulating layers 14 and 15 exclusive of the pad portions 12P and 13P defined in the desired positions of the wiring layers) is used as the form of the wiring board in a stage before the formation of the flexible bump FB or FB1; however, of course, it will be understood that the form of the wiring board is not limited to the resin substrate, as is also apparent from the spirit of the present invention. For example, the wiring board may be in a form of a silicon substrate for use in CSP (chip size package). In this case, aluminum (Al) electrode pads rather than the above-mentioned wiring layers 12 and 13 (the pad portions 12P and 13P) are formed on the silicon (Si) substrate, and passivation films made of SiN, a polyimide resin or the like, rather than the above-mentioned insulating layers 14 and 15, are provided. Also, a ceramic substrate may be used as another form.

What is claimed is:

1. A method of manufacturing a wiring board, comprising:
   fabricating a wiring board body including a pad portion formed on an electronic component mounting surface thereof;
   forming a sacrificial layer having any one of a line shape and a dot shape in a plan view and having any one of a trapezoidal shape and a semicircular shape in a cross-sectional view, in a desired portion of an insulating layer formed on the electronic component mounting surface of the wiring board body;
   forming a plated wiring to form an external connection terminal to be connected to the pad portion, on the sacrificial layer; and
   removing the sacrificial layer.

2. The method according to claim 1, wherein the plated wiring is formed by electroplating using metal which improves elasticity, as a plating seed.

3. The method according to claim 1, wherein the plated wiring is formed so as to have a cross wiring pattern in a plan view.

4. A method of manufacturing an electronic component device, comprising:
   fabricating a wiring board body including a pad portion formed on an electronic component mounting surface thereof;
   forming a sacrificial layer having any one of a line shape and a dot shape in a plan view and having any one of a trapezoidal shape and a semicircular shape in a cross-sectional view, in a desired portion of an insulating layer formed on the electronic component mounting surface of the wiring board body;
   forming a plated wiring to form an external connection terminal to be connected to the pad portion, on the sacrificial layer;
   mounting an electronic component by connecting an electrode terminal thereof to the plated wiring via a conductive bump; and
   removing the sacrificial layer.

* * * * *